(12) United States Patent
Wada et al.

(10) Patent No.: US 9,728,628 B2
(45) Date of Patent: Aug. 8, 2017

(54) SILICON CARBIDE SEMICONDUCTOR DEVICE AND METHOD FOR MANUFACTURING SAME

(71) Applicant: Sumitomo Electric Industries, Ltd., Osaka-shi (JP)

(72) Inventors: Keiji Wada, Osaka (JP); Taro Nishiguchi, Osaka (JP); Toru Hiyoshi, Osaka (JP); Taku Horii, Osaka (JP); Kosuke Uchida, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/114,009

(22) PCT Filed: Jul. 22, 2015

(86) PCT No.: PCT/JP2015/070845
§ 371 (c)(1),
(2) Date: Jul. 25, 2016

(87) PCT Pub. No.: WO2016/031439
PCT Pub. Date: Mar. 3, 2016

(65) Prior Publication Data
US 2016/0351667 A1 Dec. 1, 2016

(30) Foreign Application Priority Data
Aug. 29, 2014 (JP) .................................. 2014-175872

(51) Int. Cl.
*H01L 29/739* (2006.01)
*H01L 29/78* (2006.01)
(Continued)

(52) U.S. Cl.
CPC ...... *H01L 29/7396* (2013.01); *H01L 21/0262* (2013.01); *H01L 21/02378* (2013.01);
(Continued)

(58) Field of Classification Search
CPC ............ H01L 29/1608; H01L 29/7396; H01L 29/7395; H01L 29/4916; H01L 29/7802; H01L 21/0475; H01L 21/823487
See application file for complete search history.

(56) References Cited

U.S. PATENT DOCUMENTS

| | | | | |
|---|---|---|---|---|
| 5,363,800 A | * | 11/1994 | Larkin | .............. H01L 21/02378 117/101 |
| 8,823,015 B2 | * | 9/2014 | Momose | ................. C30B 25/20 257/77 |

(Continued)

FOREIGN PATENT DOCUMENTS

| | | |
|---|---|---|
| JP | 2005-166930 A | 6/2005 |
| JP | 2008-205296 A | 9/2008 |

(Continued)

OTHER PUBLICATIONS

International Search Report in International Application No. PCT/JP2015/070845, dated Oct. 20, 2015.

*Primary Examiner* — Joseph C Nicely
(74) *Attorney, Agent, or Firm* — Venable LLP; Michael A. Sartori; F. Brock Riggs

(57) ABSTRACT

A silicon carbide epitaxial layer includes: a first impurity region; a second impurity region; and a third impurity region. A gate insulating film is in contact with the first impurity region, the second impurity region, and the third impurity region. A groove portion is formed in a surface of the first impurity region, the surface being in contact with the gate insulating film, the groove portion extending in one direction along the surface, a width of the groove portion in the one direction being twice or more as large as a width of the groove portion in a direction perpendicular to the one direction, a maximum depth of the groove portion from the surface being not more than 10 nm.

8 Claims, 14 Drawing Sheets

(51) Int. Cl.

| | |
|---|---|
| *H01L 29/12* | (2006.01) |
| *H01L 21/04* | (2006.01) |
| *H01L 29/10* | (2006.01) |
| *H01L 29/16* | (2006.01) |
| *H01L 29/49* | (2006.01) |
| *H01L 21/02* | (2006.01) |

(52) U.S. Cl.
CPC .. *H01L 21/02433* (2013.01); *H01L 21/02529* (2013.01); *H01L 21/02576* (2013.01); *H01L 21/0475* (2013.01); *H01L 29/1095* (2013.01); *H01L 29/12* (2013.01); *H01L 29/1608* (2013.01); *H01L 29/4916* (2013.01); *H01L 29/7395* (2013.01); *H01L 29/78* (2013.01); *H01L 29/7802* (2013.01)

(56) References Cited

U.S. PATENT DOCUMENTS

| | | | | |
|---|---|---|---|---|
| 9,263,527 B2* | 2/2016 | Yamada | ............... | H01L 29/1608 |
| 2007/0108450 A1* | 5/2007 | O'Loughlin | ............ | C30B 25/02 |
| | | | | 257/77 |
| 2009/0278169 A1* | 11/2009 | Hayashi | ............... | H01L 21/046 |
| | | | | 257/183 |
| 2010/0314626 A1* | 12/2010 | Harada | ............. | H01L 21/02378 |
| | | | | 257/77 |
| 2011/0006310 A1* | 1/2011 | Nagasawa | ............. | H01L 29/045 |
| | | | | 257/77 |
| 2012/0049161 A1* | 3/2012 | Dimitrakopoulos | | H01L 21/02378 |
| | | | | 257/29 |
| 2012/0175635 A1* | 7/2012 | Weis | ................... | H01L 27/0207 |
| | | | | 257/77 |
| 2013/0029158 A1* | 1/2013 | Aigo | ...................... | C30B 25/10 |
| | | | | 428/446 |
| 2013/0062620 A1* | 3/2013 | Henning | ............... | H01L 29/872 |
| | | | | 257/77 |
| 2013/0069710 A1* | 3/2013 | Hirler | .................. | H01L 29/407 |
| | | | | 327/534 |
| 2013/0161619 A1* | 6/2013 | Wada | .................. | H01L 29/7393 |
| | | | | 257/52 |
| 2013/0248981 A1* | 9/2013 | Okumura | .......... | H01L 29/42368 |
| | | | | 257/329 |
| 2014/0054609 A1* | 2/2014 | Burk | ................... | H01L 21/3221 |
| | | | | 257/77 |
| 2014/0197422 A1* | 7/2014 | Wada | .................. | H01L 29/872 |
| | | | | 257/77 |
| 2014/0209927 A1* | 7/2014 | Nishio | ................ | H01L 29/1608 |
| | | | | 257/77 |
| 2014/0295136 A1* | 10/2014 | Ohno | ...................... | C30B 29/68 |
| | | | | 428/138 |
| 2015/0001553 A1* | 1/2015 | Kudou | .................... | H01L 29/36 |
| | | | | 257/77 |
| 2015/0214353 A1* | 7/2015 | Yamada | ............ | H01L 29/66068 |
| | | | | 257/77 |
| 2015/0279926 A1* | 10/2015 | Hiyoshi | ............ | H01L 29/66068 |
| | | | | 257/77 |
| 2015/0287817 A1* | 10/2015 | Kubota | ................. | H01L 29/36 |
| | | | | 257/77 |
| 2016/0197155 A1* | 7/2016 | Hiyoshi | ............ | H01L 21/02008 |
| | | | | 257/77 |
| 2016/0225855 A1* | 8/2016 | Hiyoshi | ............... | H01L 29/872 |
| 2016/0268381 A1* | 9/2016 | Ota | .................... | H01L 29/1608 |
| 2016/0326668 A1* | 11/2016 | Nishiguchi | ............. | C23C 16/32 |
| 2016/0351667 A1* | 12/2016 | Wada | .................... | H01L 21/0475 |
| 2016/0355949 A1* | 12/2016 | Wada | ...................... | C30B 29/36 |

FOREIGN PATENT DOCUMENTS

| | | | |
|---|---|---|---|
| JP | 2009256138 A | * | 11/2009 |
| JP | 2013-034007 A | | 2/2013 |
| JP | 5577478 B1 | | 8/2014 |

* cited by examiner

U.S. 9,728,628 B2

SILICON CARBIDE SEMICONDUCTOR DEVICE AND METHOD FOR MANUFACTURING SAME

TECHNICAL FIELD

The present disclosure relates to a silicon carbide semiconductor device and a method for manufacturing the silicon carbide semiconductor device.

BACKGROUND ART

Japanese Patent Laying-Open No. 2013-34007 (Patent Document 1) discloses a silicon carbide epitaxial wafer characterized in that there is no short step-bunching.

CITATION LIST

Patent Document

PTD 1: Japanese Patent Laying-Open No. 2013-34007

SUMMARY OF INVENTION

A silicon carbide semiconductor device according to one embodiment of the present disclosure includes a silicon carbide epitaxial layer and a gate insulating film. The silicon carbide epitaxial layer includes a first impurity region, a second impurity region, and a third impurity region, the first impurity region having a first conductivity type, the second impurity region being provided in contact with the first impurity region, the second impurity region having a second conductivity type different from the first conductivity type, the third impurity region being separated from the first impurity region by the second impurity region, the third impurity region having the first conductivity type. The gate insulating film is in contact with the first impurity region, the second impurity region, and the third impurity region. A groove portion is formed in a surface of the first impurity region, the surface being in contact with the gate insulating film, the groove portion extending in one direction along the surface, a width of the groove portion in the one direction being twice or more as large as a width of the groove portion in a direction perpendicular to the one direction, a maximum depth of the groove portion from the surface being not more than 10 nm.

A method for manufacturing a silicon carbide semiconductor device according to one embodiment of the present disclosure includes the following steps. There is prepared a silicon carbide epitaxial layer including a first impurity region, a second impurity region, and a third impurity region, the first impurity region having a first conductivity type, the second impurity region being provided on the first impurity region, the second impurity region having a second conductivity type different from the first conductivity type, the third impurity region being separated from the first impurity region by the second impurity region, the third impurity region having the first conductivity type. A gate insulating film is formed in contact with the first impurity region, the second impurity region, and the third impurity region. A groove portion is formed in a surface of the first impurity region, the surface being in contact with the gate insulating film, the groove portion extending in one direction along the surface, a width of the groove portion in the one direction being twice or more as large as a width of the groove portion in a direction perpendicular to the one direction, a maximum depth of the groove portion from the surface being not more than 10 nm.

DESCRIPTION OF EMBODIMENTS

Description of Embodiments of Present Disclosure

Figure 1:
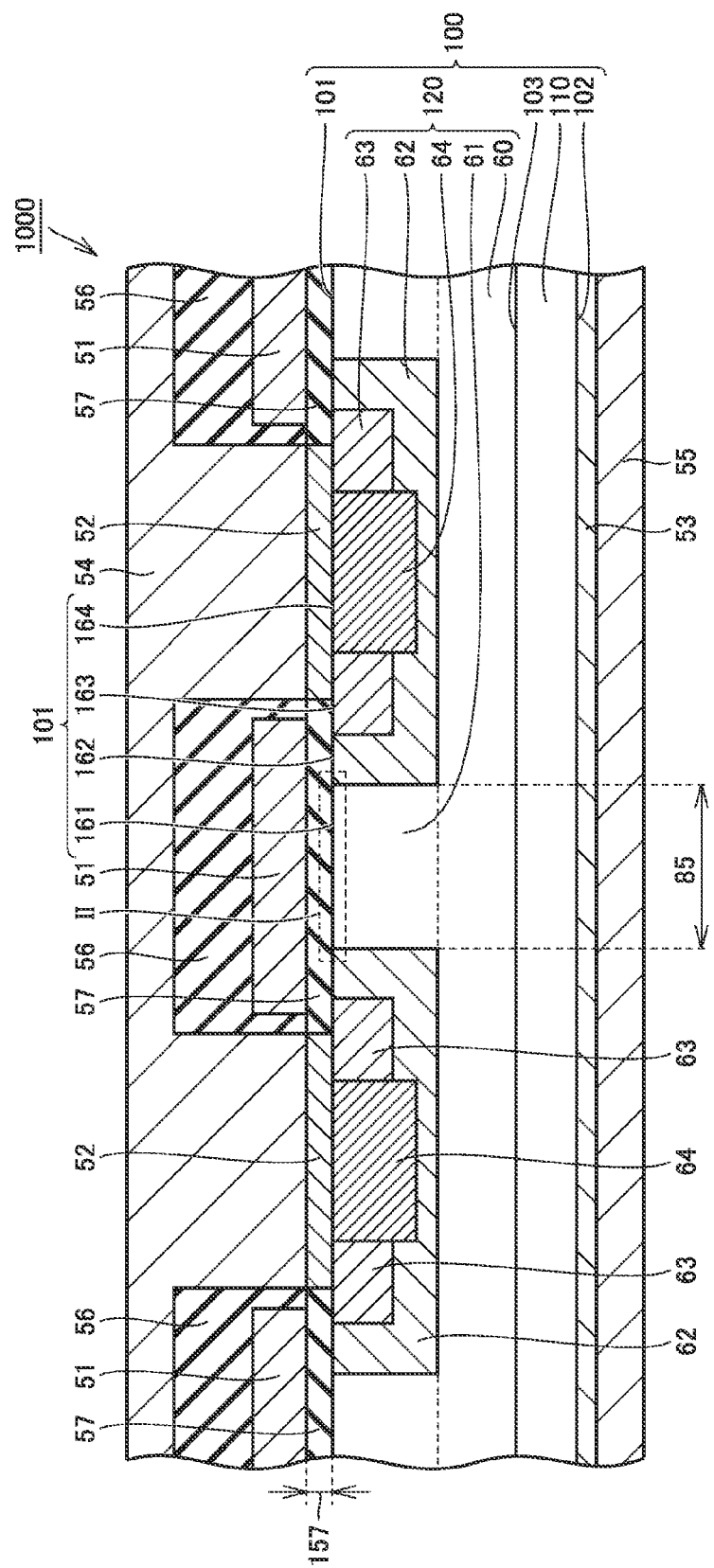
FIG. 1 is a schematic cross sectional view showing a structure of a silicon carbide semiconductor device according to the present embodiment.

First, embodiments of the present disclosure are listed and described.

[1] A silicon carbide semiconductor device 1000 according to one embodiment of the present disclosure includes a silicon carbide epitaxial layer 120 and a gate insulating film 57. Silicon carbide epitaxial layer 120 includes a first impurity region 61, a second impurity region 62, and a third impurity region 63, first impurity region 61 having a first conductivity type, second impurity region 62 being provided in contact with first impurity region 61, second impurity region 62 having a second conductivity type different from the first conductivity type, third impurity region 63 being separated from first impurity region 61 by second impurity region 62, third impurity region 63 having the first conductivity type. Gate insulating film 57 is in contact with first impurity region 61, second impurity region 62, and third impurity region 63. A groove portion 20 is formed in a surface 161 of first impurity region 61, surface 161 being in contact with gate insulating film 57, groove portion 20 extending in one direction along surface 161, a width of groove portion 20 in the one direction being twice or more as large as a width of groove portion 20 in a direction perpendicular to the one direction, a maximum depth of groove portion 20 from surface 161 being not more than 10 nm.

Hereinafter, the width of groove portion 20 in the one direction will be referred to as "second width 82", the width of groove portion 20 in the direction perpendicular to the one direction will be referred to as "third width 83", and the maximum depth of groove portion 20 from surface 161 will be referred to as "second depth 72".

When forming a silicon carbide epitaxial layer on a silicon carbide substrate, minute pit portions 30 (see FIG. 3 and FIG. 5) may be formed in a main surface of the silicon carbide epitaxial layer. Each of such pit portions is formed due to a threading dislocation transferred from the silicon carbide substrate to the silicon carbide epitaxial layer, and is a depression having a depth of about several ten nm. The present inventor has found that: pit portions formed in a surface of a JFET (Junction Field Effect Transistor) region causes increase in variation in film thickness of a gate insulating film formed on the JFET region; and the variation in film thickness is one factor for decrease in long-term reliability of the silicon carbide semiconductor device.

The present inventor has found that the formation of pit portions can be suppressed under a specific epitaxial growth condition. According to the growth condition, the pit portions are reduced whereas a multiplicity of groove portions are formed which are shallower than the pit portions and which extend in one direction. However, it has been found that the groove portions are shallower than the pit portions and therefore have a smaller influence over the variation in film thickness of the gate insulating film than the influence of the pit portions.

In silicon carbide semiconductor device 1000 according to [1], groove portion 20 is formed in surface 161 of first impurity region 61 in contact with gate insulating film 57, groove portion 20 extending in the one direction along surface 161, second width 82 of groove portion 20 being twice or more as large as third width 83, second depth 72 of groove portion 20 being not more than 10 nm. According to silicon carbide semiconductor device 1000 in which groove portion 20 is formed, variation in the film thickness of gate insulating film 57 can be reduced as compared with the conventional silicon carbide semiconductor device in which a multiplicity of pit portions are formed. Accordingly, in accordance with the silicon carbide semiconductor device according to [1], long-term reliability is improved as compared with the conventional silicon carbide semiconductor device.

The shape of the "groove portion" can be specified by observing surface 161 of JFET region 61 using a predetermined defect inspection device. For example, the defect inspection device can be employed to measure second width 82 and third width 83 of groove portion 20 in surface 161 of JFET region 61 after removing gate insulating film 57 from JFET region 61. As the defect inspection device, WASAVI series "SICA 6X" provided by Lasertec Corporation (objective lens: ×10) can be used, for example. Moreover, the depth of the "groove portion" can be measured using an AFM (Atomic Force Microscope). It should be noted that the gate insulating film is desirably removed using diluted aqueous hydrogen fluoride (HF).

[2] In [1], a width of surface 161 of first impurity region 61 in a direction along a direction parallel to surface 161 of first impurity region 61 may be not less than 1.5 µm and not more than 3.5 µm. Hereinafter, the width of surface 161 of first impurity region 61 will be also referred to as "fifth width 85". By setting fifth width 85 at not less than 1.5 µm, it is possible to suppress significant increase of transistor resistance resulting from increase of JFET resistance. By setting fifth width 85 at not more than 3.5 µm, gate insulating film 57 on JFET region 61 is protected by depletion from second impurity region 62, and increase of on resistance of the semiconductor device resulting from increase of unit cell area can be suppressed.

[3] In [1] or [2], a thickness 157 of gate insulating film 57 in a direction perpendicular to surface 161 of first impurity region 61 may be not less than 40 nm and not more than 100 nm. By setting thickness 157 of gate insulating film 57 at not less than 40 nm, reliability of gate insulating film 57 can be suppressed from being decreased. By setting thickness 157 of gate insulating film 57 at not more than 100 nm, it is possible to suppress increase of voltage applied between gate electrode 51 and source electrode 52 and required to turn on the transistor.

[4] In any one of [1] to [3], a density of nitrogen atoms may be not less than $10^{18}$ cm$^{-3}$ in a boundary region between gate insulating film 57 and first impurity region 61. Accordingly, reliability of gate insulating film 57 may be improved.

[5] In any one of [1] to [4], groove portion 20 may include a first groove portion 21 and a second groove portion 22 connected to first groove portion 21. First groove portion 21 may be formed in one end portion of groove portion 20 in the one direction. Second groove portion 22 may extend in the one direction from first groove portion 21 to the other end portion opposite to the one end portion, and a depth of second groove portion 22 from surface 161 may be smaller than a maximum depth of first groove portion 21.

Hereinafter, the depth of second groove portion 22 from surface 161 will be also referred to as "first depth 71".

[6] In [5], gate insulating film 57 may be provided on first groove portion 21.

[7] In any one of [1] to [6], the silicon carbide semiconductor device may further include a silicon carbide substrate 110 having an off angle of not more than ±4° relative to a (0001) plane. Silicon carbide epitaxial layer 120 may be a layer epitaxially grown on silicon carbide substrate 110. Groove portion 20 may be formed to extend from a threading dislocation 40 in silicon carbide epitaxial layer 120 in a step-flow growth direction that is along the off direction of the off angle.

Here, the expression "substrate having an off angle of not more than ±4° relative to a (0001) plane" refers to a substrate having two main surfaces, one of which has an off angle of not more than ±4° relative to the (0001) plane.

[8] In [7], the off direction may be in a range of not more than ±5° relative to a <11-20> direction.

[9] In [7], the off direction may be in a range of not more than ±5° relative to a <01-10> direction.

[10] A method for manufacturing a silicon carbide semiconductor device according to one embodiment of the present disclosure includes the following steps. There is prepared a silicon carbide epitaxial layer 120 including a first impurity region 61, a second impurity region 62, and a third impurity region 63, first impurity region 61 having a first conductivity type, second impurity region 62 being provided on first impurity region 61, second impurity region 62 having a second conductivity type different from the first conductivity type, third impurity region 63 being separated from first impurity region 61 by second impurity region 62, third impurity region 63 having the first conductivity type. A gate insulating film 57 is formed in contact with first impurity region 61, second impurity region 62, and third impurity region 63. A groove portion 20 is formed in a surface 161 of first impurity region 61, surface 161 being in contact with gate insulating film 57, groove portion 20 extending in one direction along surface 161, a width (second width 82) of groove portion 20 in the one direction being twice or more as large as a width (third width 83) of groove portion 20 in a direction perpendicular to the one direction, a maximum depth (second depth 72) of groove portion 20 from surface 161 being not more than 10 nm.

In accordance with the method for manufacturing the silicon carbide semiconductor device according to [10], gate insulating film 57 is formed on the surface of the impurity region in which a larger number of groove portions 20 are formed than the pit portions having a depth of several ten nm. Hence, in accordance with the manufacturing method according to [10], there can be manufactured a silicon carbide semiconductor device in which variation in film thickness of gate insulating film 57 is small. That is, in accordance with the manufacturing method according to [10], a silicon carbide semiconductor device having improved long-term reliability can be manufactured.

[11] The manufacturing method according to [10] may further include the step of heating gate insulating film 57 at a temperature of not less than 1100° C. in an atmosphere including nitrogen atoms after the step of forming gate insulating film 57. Accordingly, reliability of gate insulating film 57 may be improved.

[12] The manufacturing method according to [10] or [11] may further include the step of preparing a silicon carbide substrate before the step of preparing the silicon carbide epitaxial layer. The step of preparing the silicon carbide epitaxial layer can include the steps of: forming a first epitaxial layer on the silicon carbide substrate using a source material gas having a C/Si ratio of less than 1; reconstructing a surface of the first epitaxial layer using a mixed gas including (i) a source material gas having a C/Si ratio of less than 1 and (ii) a hydrogen gas; and forming a second epitaxial layer on the reconstructed surface of the first epitaxial layer using a source material gas having a C/Si ratio of not less than 1.

In [12], the "C/Si ratio" represents a ratio of the number of carbon (C) atoms to the number of silicon (Si) atoms in the source material gas. The expression "reconstructing the surface" indicates to change a surface property of the first epitaxial layer through etching by the hydrogen gas and through epitaxial growth by the source material gas. Through the step of reconstructing, the thickness of the first epitaxial layer may be decreased, may be increased, or may be substantially unchanged.

In the step of reconstructing the surface, the ratio of the flow rate of the source material gas to the flow rate of the hydrogen gas may be reduced as compared with general epitaxial growth such that the etching by the hydrogen gas is comparable to the epitaxial growth by the source material gas. For example, it is considered to adjust the flow rate of the hydrogen gas and the flow rate of the source material gas to attain a film formation rate of about 0±0.5 μm/h.

The above-described threading dislocations include threading screw dislocations, threading edge dislocations, and composite dislocations in which these dislocations are mixed. These dislocations are expressed by Burgers vector b in the following manner: threading screw dislocations (b=<0001>); threading edge dislocations (b=⅓<11-20>); and composite dislocations (b=<0001>+⅓<11-20>). It is considered that the pit portions having an influence over reliability of the gate insulating film are formed due to the threading screw dislocations, the threading edge dislocations, and the composite dislocations. Pits formed due to the threading screw dislocations and composite dislocations both involving relatively large strain around the dislocations have deep depths.

In [12], the surface of the first epitaxial layer is reconstructed, whereby it can be expected to obtain an effect of attaining shallow pit portions formed due to threading screw dislocations and composite dislocations. In addition to this, the C/Si ratio of the source material gas is changed from a value of less than 1 to a value of not less than 1 and the second epitaxial layer is then grown. Accordingly, it is considered to increase the effect of attaining shallow pit portions resulting from threading screw dislocations and composite dislocations.

Details of Embodiments of Present Disclosure

Next, the following describes one embodiment (hereinafter, also referred to as "the present embodiment") of the present disclosure with reference to figures. In the figures below, the same or corresponding elements are given the same reference characters and are not described repeatedly. In the present specification, an individual orientation is represented by [ ], a group orientation is represented by < >, and an individual plane is represented by ( ), and a group plane is represented by { }. Normally, a negative index is supposed to be crystallographically indicated by putting "–" (bar) above a numeral, but is indicated by putting the negative sign before the numeral in the present specification.

[Silicon Carbide Semiconductor Device]

First, the following describes a structure of a MOSFET (Metal Oxide Semiconductor Field Effect Transistor), which serves as a silicon carbide semiconductor device according to the present embodiment.

FIG. 1 shows one unit cell of a MOSFET and its periphery. As shown in FIG. 1, a MOSFET 1000 is a vertical type MOSFET having a planar structure. In the present embodiment, a chip size, i.e., an effective area of a semiconductor chip constituted of a plurality of unit cells, is about 1 mm$^2$ to 100 mm$^2$, for example. Here, the "effective area" refers to an area of a region of the semiconductor chip except a gate pad region for wire bonding, a gate runner, and a termination structure portion for holding a breakdown voltage.

MOSFET 1000 includes an epitaxial wafer 100, gate insulating films 57, gate electrodes 51, source electrodes 52, a drain electrode 53, a source pad electrode 54, a backside pad electrode 55, and interlayer insulating films 56.

Epitaxial wafer 100 has a silicon carbide substrate 110, and a silicon carbide epitaxial layer 120 provided on silicon carbide substrate 110. Silicon carbide substrate 110 has a second main surface 102 and a third main surface 103 opposite to second main surface 102. Silicon carbide epitaxial layer 120 is formed on third main surface 103. Silicon carbide epitaxial layer 120 has a first main surface 101 opposite to silicon carbide substrate 110. Silicon carbide epitaxial layer 120 has a drift region 60, body regions 62, source regions 63, and contact regions 64.

Drift region 60 is provided on third main surface 103. Drift region 60 includes an n type impurity such as nitrogen (N), and has n type conductivity (first conductivity type). Drift region 60 includes a JFET region 61 that is interposed between body regions 62 and that constitutes a portion of first main surface 101 when viewed in a cross section (when viewed in a direction parallel to first main surface 101). Furthermore, drift region 60 includes: a region interposed between JFET region 61 and third main surface 103; and a region interposed between each body region 62 and third main surface 103. Drift region 60 and JFET region 61 include an n type impurity and have n type conductivity.

A width (fifth width 85) of a surface 161 of JFET region 61 in a direction parallel to surface 161 of JFET region 61 may be not less than 1.5 µm and not more than 3.5 µm, or may be not less than 2 µm and not more than 3 µm.

For example, an n type impurity such as phosphorus (P) may be additionally added to the JFET region. The impurity may be added through ion implantation, for example. When the concentration of the n type impurity in the drift region is low and the breakdown voltage of the drift region is large, the concentration of the n type impurity may be adjusted in accordance with the width (fifth width 85) of the JFET region. The concentration of the n type impurity is adjusted to fall within the range of about $7 \times 10^{15}$ cm$^{-3}$ to $1 \times 10^{17}$ cm$^{-3}$, for example.

Body region 62 includes a p type impurity such as aluminum (Al) or boron (B), and has p type conductivity (second conductivity type) different from n type conductivity, for example. Body region 62 constitutes a portion of first main surface 101. A region of body region 62 adjacent to gate insulating film 57 serves as a channel. Body region 62 is provided in contact with both JFET region 61 and drift region 60.

Source region 63 includes an n type impurity such as phosphorus (P), and has n type conductivity, for example. Source region 63 constitutes a portion of first main surface 101. Source region 63 is separated from JFET region 61 and drift region 60 by body region 62. Each of the side surfaces and bottom surface of source region 63 is in contact with body region 62. The concentration of the n type impurity included in source region 63 may be higher than the concentration of the n type impurity included in drift region 60.

Contact region 64 includes a p type impurity such as aluminum (Al) and boron (B), and has p type conductivity, for example. Contact region 64 constitutes a portion of first main surface 101. Contact region 64 extends through source region 63, and connects source electrode 52 to body region 62. The concentration of the p type impurity included in contact region 64 may be higher than the concentration of the p type impurity included in body region 62.

In first main surface 101, gate insulating film 57 is in contact with JFET region 61, body region 62, and source region 63. Gate insulating film 57 is a gate oxide film composed of, for example, a material such as silicon dioxide. A thickness 157 of a portion of gate insulating film 57 in a direction perpendicular to surface 161 of JFET region 61 may be not less than 40 nm and not more than 100 nm, or may be not less than 45 nm and not more than 65 nm.

Gate electrode 51 is composed of a conductor such as aluminum or polysilicon having an impurity added therein, for example. Gate electrode 51 is provided on gate insulating film 57, and is disposed to face JFET region 61, body region 62, and source region 63.

In first main surface 101, source electrode 52 is in contact with both source region 63 and contact region 64. Preferably, source electrode 52 is in ohmic junction with source region 63. More preferably, source electrode 52 is in ohmic junction with contact region 64. Source electrode 52 is composed of a material such as nickel silicon (Ni$_x$Si$_y$), titanium silicon (Ti$_x$Si$_y$), aluminum silicon (Al$_x$Si$_y$), or titanium aluminum silicon (Ti$_x$Al$_y$Si$_z$, where x, y, z>0), for example.

Drain electrode 53 is formed in contact with second main surface 102 of silicon carbide substrate 110. Drain electrode 53 is composed of a material capable of ohmic junction with silicon carbide having n type conductivity, such as nickel silicon, for example. Drain electrode 53 may be composed of the same material as that of source electrode 52. Drain electrode 53 is electrically connected to silicon carbide substrate 110. Interlayer insulating film 56 is composed of, for example, a material including silicon dioxide, and is formed to surround gate electrode 51. Interlayer insulating film 56 electrically insulates between gate electrode 51 and source electrode 52.

Source pad electrode 54 is formed to cover source electrode 52 and interlayer insulating film 56. Source pad electrode 54 is composed of a material including aluminum (Al), for example. Source pad electrode 54 is electrically connected to source region 63 via source electrode 52. Backside pad electrode 55 is composed of a material including aluminum (Al), for example. Backside pad electrode 55 is electrically connected to silicon carbide substrate 110 via drain electrode 53.

Figure 2:
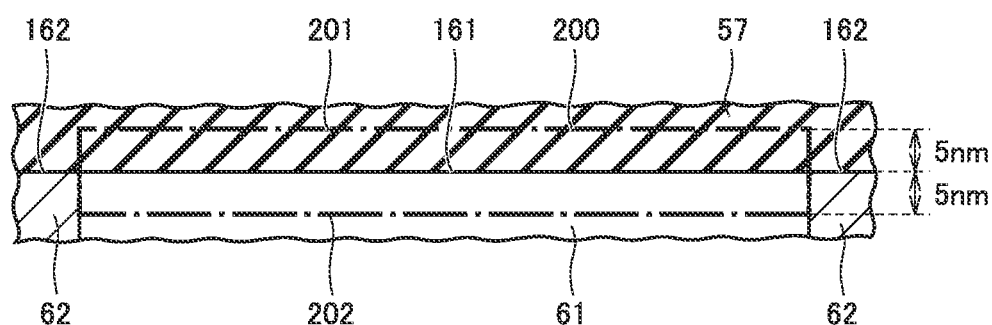
FIG. 2 is an enlarged view of a region II in FIG. 1.

The density of nitrogen atoms is not less than $10^{18}$ cm$^{-3}$ in a boundary region 200 between gate insulating film 57 and JFET region 61 as shown in FIG. 2. Boundary region 200 between gate insulating film 57 and JFET region 61 refers to a region interposed between a first imaginary plane 201 and a second imaginary plane 202, wherein first imaginary plane 201 is located to be displaced by 5 nm to the gate electrode 51 side and second imaginary plane 202 is located to be displaced by 5 nm to the silicon carbide substrate 110 side in the direction perpendicular to surface 161, relative to surface 161 of JFET region 61 that is in contact with gate insulating film 57. The density of the nitrogen atoms can be measured, for example, by SIMS (Secondary Ion Mass Spectrometry). Preferably, the density of the nitrogen atoms in boundary region 200 is not less than $10^{18}$ cm$^{-3}$ and not more than $10^{21}$ cm$^{-3}$.

[Epitaxial Wafer]

Next, the following describes a configuration of epitaxial wafer 100 included in MOSFET 1000 according to the present embodiment.

Figure 3:
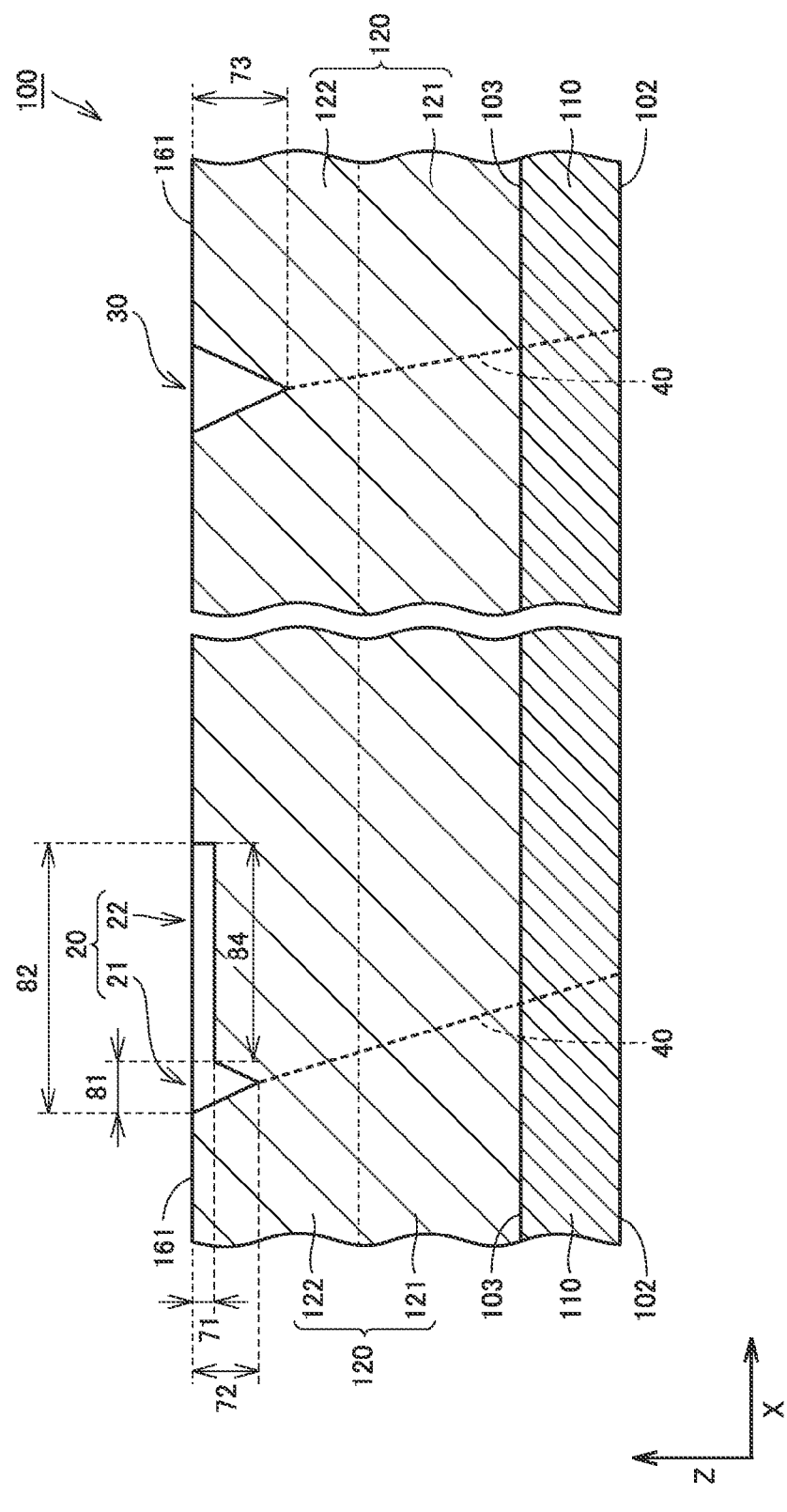
FIG. 3 is a schematic cross sectional view showing a portion of an epitaxial wafer included in the silicon carbide semiconductor device according to the present embodiment.

As shown in FIG. 3, epitaxial wafer 100 according to the present embodiment has silicon carbide substrate 110 and silicon carbide epitaxial layer 120. Silicon carbide substrate 110 is composed of a silicon carbide single crystal, for example. This silicon carbide single crystal has a hexagonal crystal structure and has a polytype of 4H, for example. Silicon carbide substrate 110 includes an n type impurity such as nitrogen (N) and therefore has n type conductivity.

Silicon carbide substrate 110 has second main surface 102 and third main surface 103 opposite to second main surface 102. Third main surface 103 has a diameter of not less than 100 mm (not less than 4 inches), preferably, not less than 150 mm (not less than 6 inches), for example. Third main surface 103 may have a diameter of not more than 300 mm (not more than 12 inches). As shown in FIG. 1, silicon carbide epitaxial layer 120 is formed on third main surface 103. Third main surface 103 has an off angle of not more than ±4° relative to a (0001) plane (hereinafter, referred to as "silicon (Si) plane"), for example. The off direction of this off angle may be in a range of not more than ±5° relative to a <11-20> direction or may be in a range of not more than ±5° relative to a <01-10> direction, for example.

The silicon carbide epitaxial layer has first main surface 101 opposite to silicon carbide substrate 110.

Silicon carbide epitaxial layer 120 is a silicon carbide single crystal film formed on third main surface 103 of silicon carbide substrate 110 through vapor phase epitaxy, for example. More specifically, silicon carbide epitaxial layer 120 is an epitaxial growth layer formed by CVD (Chemical Vapor Deposition) employing silane ($SiH_4$) and propane ($C_3H_8$) as a source material gas and nitrogen ($N_2$) or ammonia ($NH_3$) as a dopant gas. Silicon carbide epitaxial layer 120 includes nitrogen (N) atoms, which are generated through thermal decomposition of the nitrogen or ammonia, and therefore has n type conductivity type. Preferably, the concentration of the n type impurity included in silicon carbide epitaxial layer 120 is lower than the concentration of the n type impurity included in silicon carbide substrate 110. Since third main surface 103 is angled off relative to the (0001) plane as described above, silicon carbide epitaxial layer 120 is formed through step-flow growth. Hence, silicon carbide epitaxial layer 120 is composed of silicon carbide having a polytype of 4H as with silicon carbide substrate 110 and therefore a different type of polytype is suppressed from being mixed therein. Silicon carbide epitaxial layer 120 has a thickness of approximately not less than 5 μm and not more than 150 μm, for example.

Figure 4:
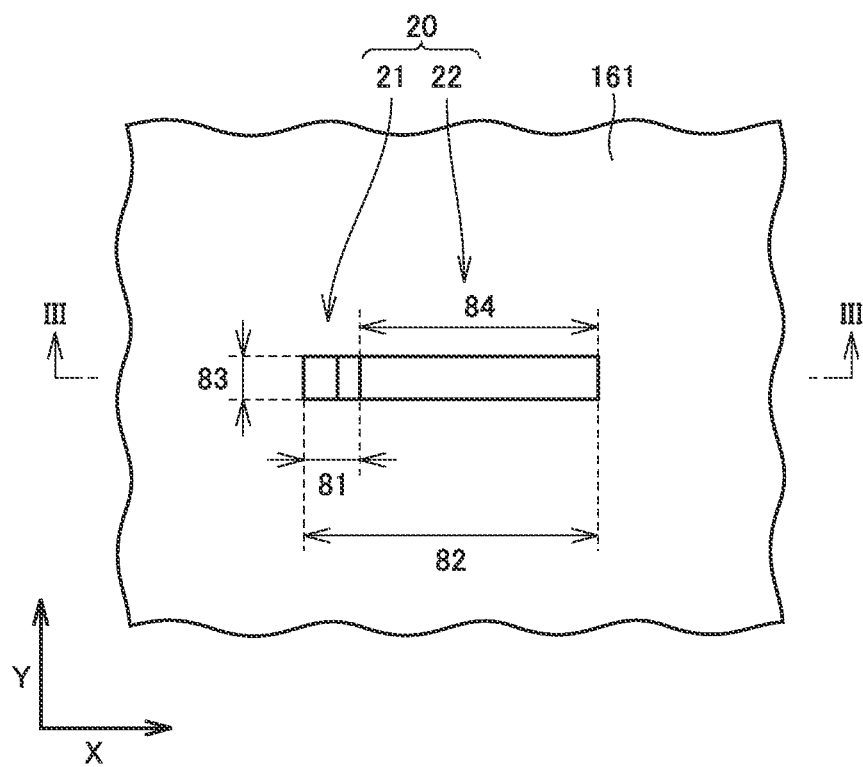
FIG. 4 is a schematic plan view showing a portion of the epitaxial wafer included in the silicon carbide semiconductor device according to the present embodiment.

As shown in FIG. 4, a groove portion 20 is formed in surface 161 of JFET region 61. Groove portion 20 extends in one direction along surface 161 when surface 161 is viewed in plan (field of view in the direction perpendicular to surface 161). More specifically, groove portion 20 extends in a step-flow growth direction, which is along the off direction of the off angle relative to the (0001) plane. In other words, groove portion 20 extends in a direction in a range of not more than ±5° relative to the <11-20> direction or a direction in a range of not more than ±5° relative to the <01-10> direction.

Figure 5:
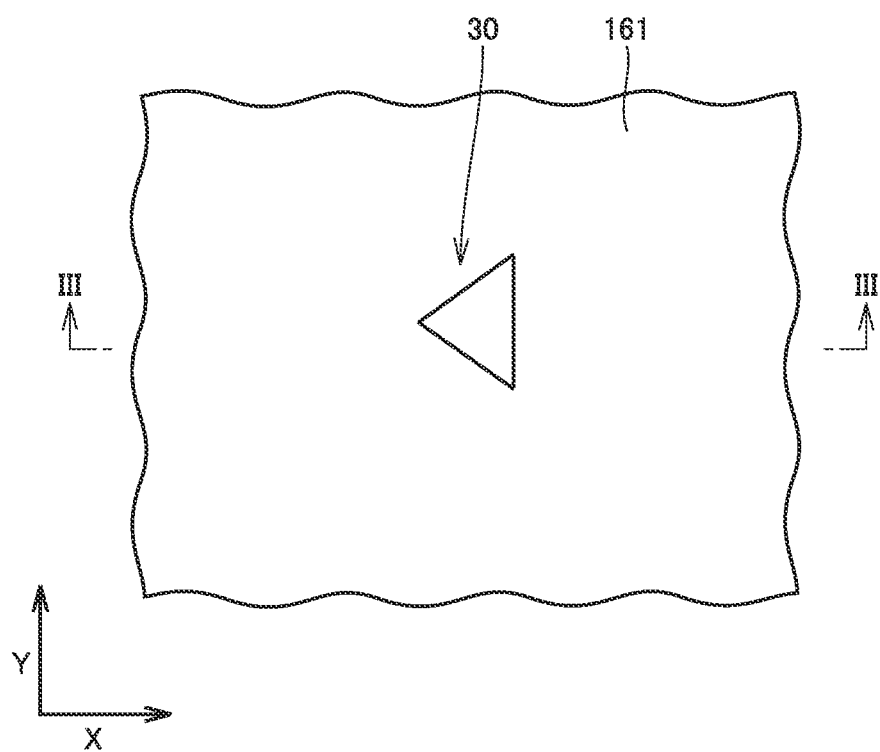
FIG. 5 is a schematic plan view showing a portion of the epitaxial wafer included in the silicon carbide semiconductor device according to the present embodiment.

It should be noted that FIG. 3 to FIG. 5 are drawn such that the "step-flow growth direction" corresponds to the X-axis direction in FIG. 3 to FIG. 5. In each of FIG. 3 to FIG. 5, the X-axis direction, Y-axis direction, and Z-axis direction are orthogonal to one another. The Y-axis direction shown in each of FIG. 4 and FIG. 5 represents a direction perpendicular to the step-flow growth direction. The Z-axis direction shown in FIG. 3 represents the thickness direction of the silicon carbide epitaxial layer.

The width (second width 82) of groove portion 20 in the above-described one direction is twice or more as large as, preferably, five times or more as large as the width (third width 83) thereof in the direction perpendicular to the one direction. Second width 82 is not less than 15 μm and not more than 50 μm, preferably, not less than 25 μm and not more than 35 μm. Third width 83 is not less than 1 μm and not more than 5 μm, preferably, not less than 2 μm and not more than 3 μm.

As shown in FIG. 3, groove portion 20 is formed to extend in the step-flow growth direction from a threading dislocation 40 included in silicon carbide epitaxial layer 120. More specifically, groove portion 20 includes: a first groove portion 21 formed on threading dislocation 40; and a second groove portion 22 formed to be connected to first groove portion 21 and extend from first groove portion 21 in the step-flow growth direction.

First groove portion 21 is formed at one end portion (left end portion in FIG. 3) of groove portion 20 in the step-flow growth direction. Moreover, the maximum depth (second depth 72) of first groove portion 21 from first main surface 101 is not more than 10 nm. Second depth 72 is the maximum depth in the entire groove portion 20 as shown in FIG. 3. First groove portion 21 preferably has a width (first width 81) of not more than 1 μm, and more preferably has a width (first width 81) of not more than 0.5 μm.

As shown in FIG. 3, second groove portion 22 is formed to extend from its portion of connection with first groove portion 21 to the other end portion opposite to the above-described one end portion (right end portion in FIG. 3). Moreover, second groove portion 22 is formed such that a depth (first depth 71) of second groove portion 22 from first main surface 101 is smaller than the maximum depth (second depth 72) of first groove portion 21. More specifically, second groove portion 22 extends in the step-flow growth direction while maintaining the depth shallower than the maximum depth (second depth 72) of first groove portion 21. First depth 71 is preferably not more than 3 nm, is more preferably not more than 2 nm, and is further preferably not more than 1 nm. Moreover, second groove portion 22 has a width (fourth width 84) of, for example, not less than 20 μm, preferably, not less than 25 μm.

As shown in FIG. 1 and FIG. 3, gate insulating film 57 is provided in contact with surface 161 of JFET region 61, surface 162 of body region 62, and surface 163 of source region 63. Gate insulating film 57 is provided on groove portion 20 provided in surface 161, and is preferably provided on first groove portion 21. Gate insulating film 57 may be provided on second groove portion 22 provided in surface 161, or may be provided on pit portion 30. As shown in FIG. 3 and FIG. 5, pit portion 30 may be provided in surface 161. As shown in FIG. 3, pit portion 30 is formed due to threading dislocation 40 extending from silicon carbide substrate 110 into silicon carbide epitaxial layer 120. The maximum depth (third depth 73) of pit portion 30 is larger than 10 nm, more specifically, larger than 20 nm. As shown in FIG. 5, in a plan view, pit portion 30 may have a triangular shape. Gate insulating film 57 may be provided to fill first groove portion 21 and second groove portion 22 included in groove portion 20.

[Method for Manufacturing Silicon Carbide Semiconductor Device]

Next, the following describes a method for manufacturing MOSFET 1000 according to the present embodiment.

Figure 6:
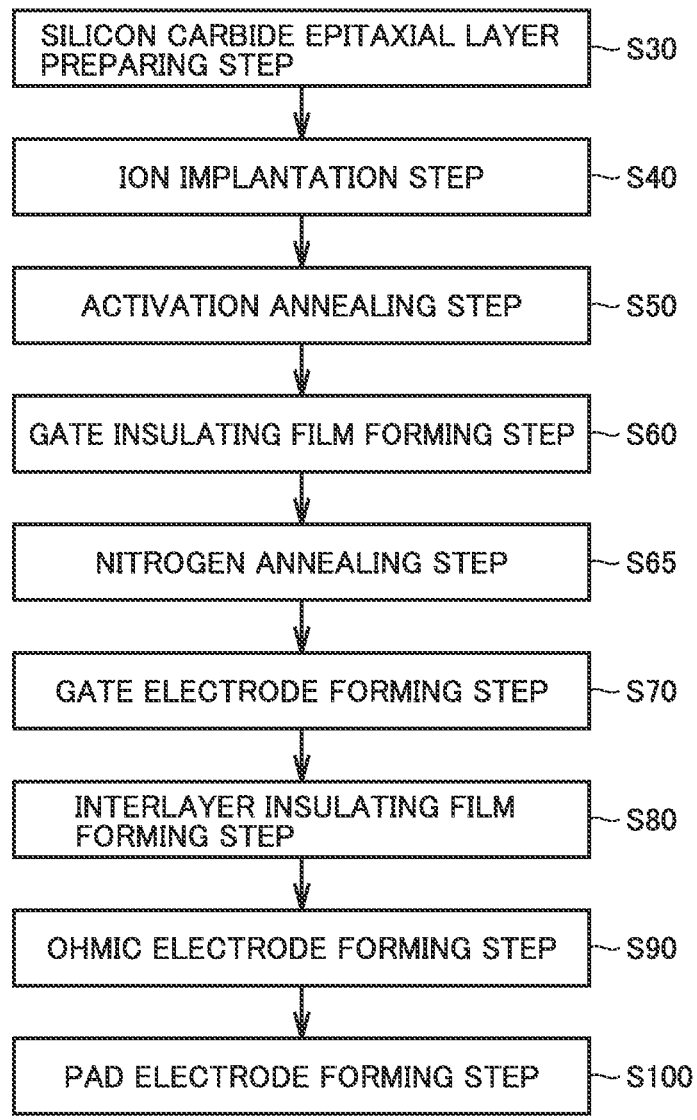
FIG. 6 is a flowchart schematically showing a method for manufacturing the silicon carbide semiconductor device according to the present embodiment.
Figure 7:
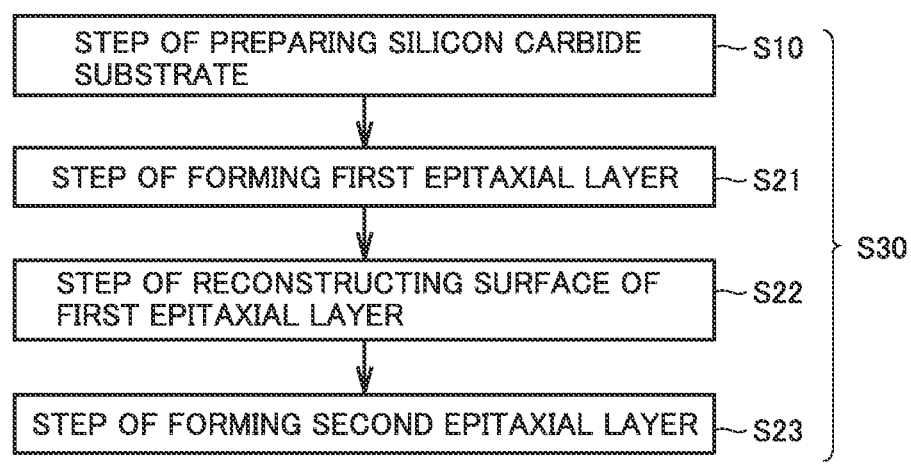
FIG. 7 is a flowchart schematically showing a silicon carbide epitaxial layer preparing step according to the present embodiment.

First, as shown in FIG. 6, a silicon carbide epitaxial layer preparing step (S30) is performed. As shown in FIG. 7, the silicon carbide epitaxial layer preparing step (S30) includes: a step (S10) of preparing a silicon carbide substrate; a step (S21) of forming a first epitaxial layer; a step (S22) of reconstructing a surface of the first epitaxial layer; and a step (S23) of forming a second epitaxial layer on the reconstructed surface.

In the step (S10) of preparing the silicon carbide substrate, a silicon carbide ingot (not shown) having a polytype of 4H and obtained through crystal growth using a sublimation-recrystallization method is sliced into a predetermined thickness, thereby preparing silicon carbide substrate 110 (FIG. 10), for example. Silicon carbide substrate 110 has second main surface 102 and third main surface 103 opposite to second main surface 102. As shown in FIG. 11, silicon carbide epitaxial layer 120 is formed on third main surface 103. Third main surface 103 has an off angle of not more than ±4° relative to the (0001) plane, for example. The off direction of this off angle may be in a range of not more than ±5° relative to the <11-20> direction or may be in a range of not more than ±5° relative to the <01-10> direction, for example.

Figure 8:
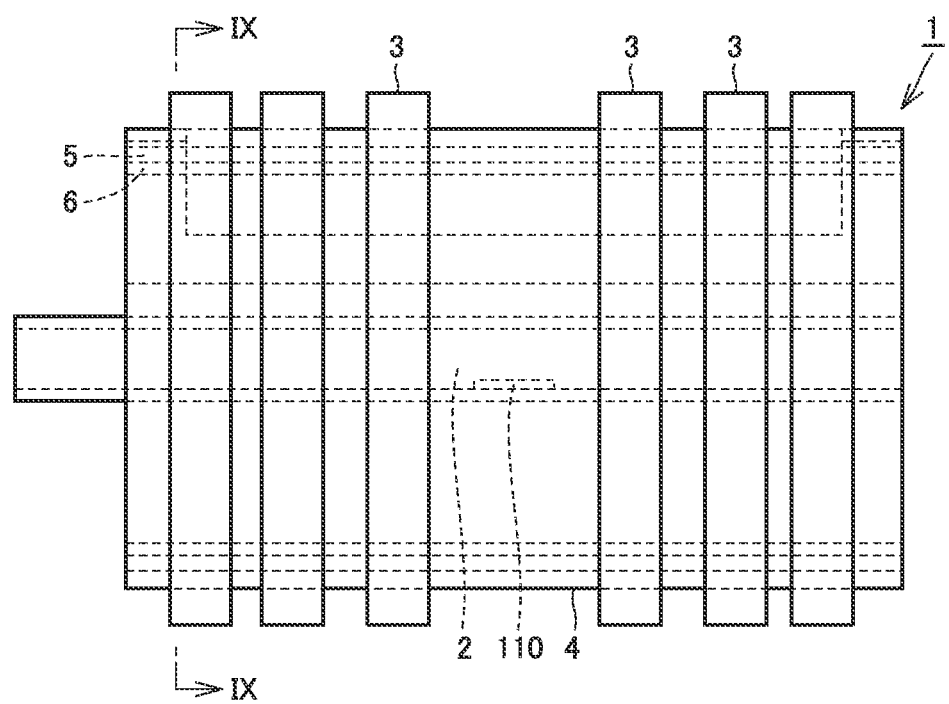
FIG. 8 is a schematic side view showing a configuration of an epitaxial growth device.
Figure 9:
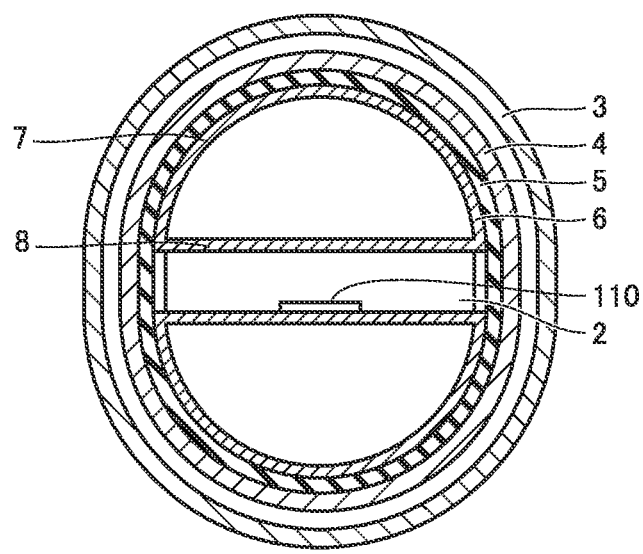
FIG. 9 is a schematic cross sectional view showing a cross section taken along a line segment IX-IX in FIG. 8.
Figure 10:
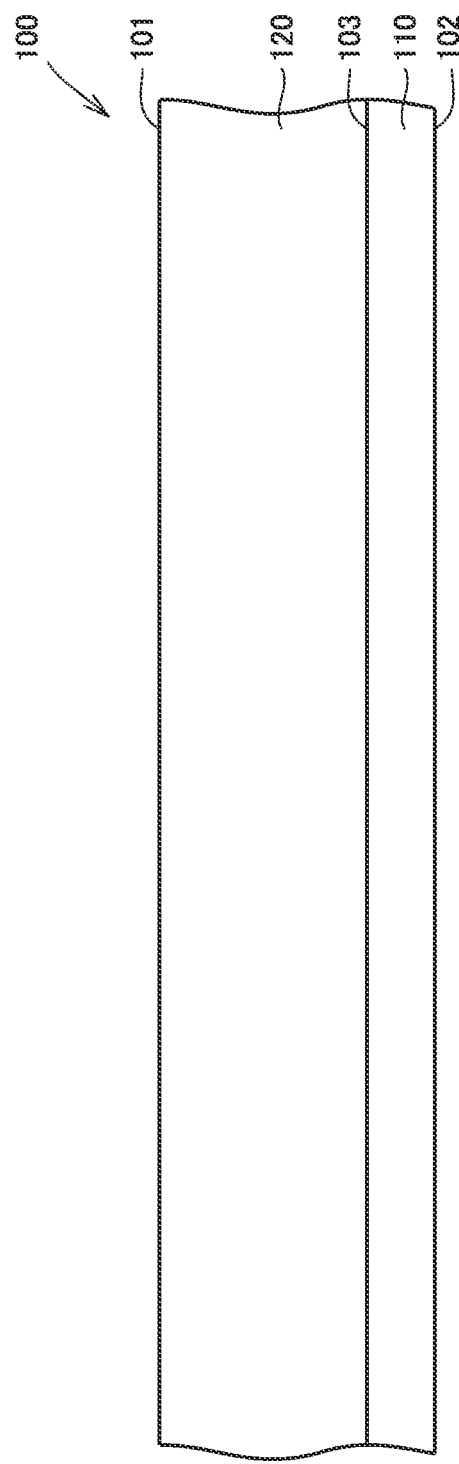
FIG. 10 is a schematic cross sectional view showing a first step of the method for manufacturing the silicon carbide semiconductor device according to the present embodiment.
Figure 11:
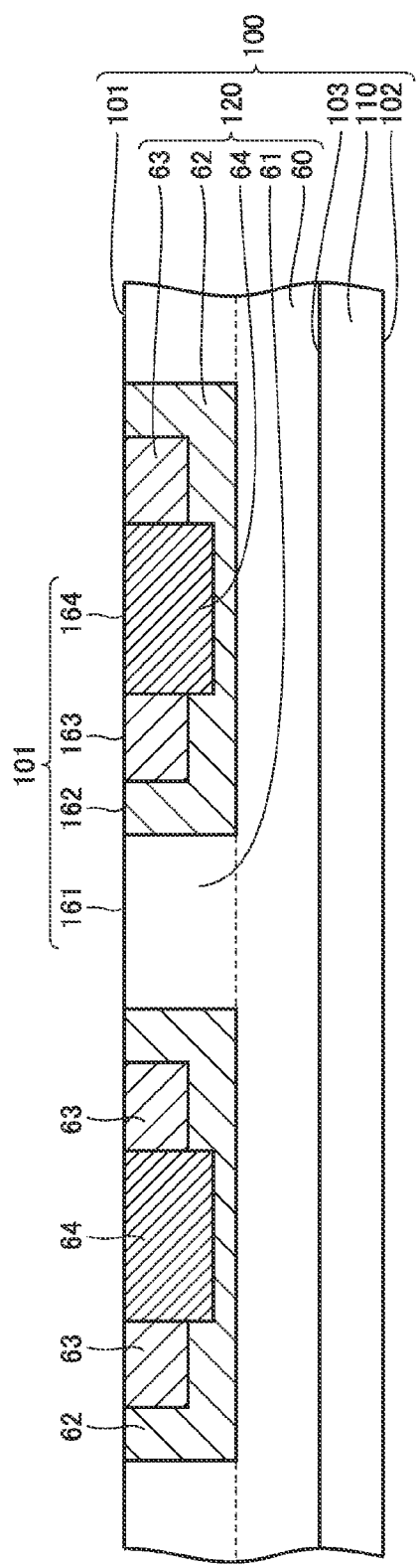
FIG. 11 is a schematic cross sectional view showing a second step of the method for manufacturing the silicon carbide semiconductor device according to the present embodiment.

Next, as shown in FIG. 10, CVD is employed to epitaxially grow silicon carbide epitaxial layer 120 on third main surface 103. Here, the configuration of an epitaxial growth device 1 will be described first with reference to FIG. 8 and FIG. 9. FIG. 8 is a side view of epitaxial growth device 1.

FIG. 9 is a cross sectional view of epitaxial growth device 1 along a line segment IX-IX in FIG. 8.

As shown in FIG. 8 and FIG. 9, epitaxial growth device 1 mainly includes heating elements 6, a heat insulator 5, a quartz tube 4, and an induction heating coil 3. Each of heating elements 6 is composed of a carbon material, for example. As shown in FIG. 9, heating element 6 has a semi-cylindrical hollow structure including a curved portion 7 and a flat portion 8. Two heating elements 6 are provided and disposed such that their respective flat portions 8 face each other. A space surrounded by these flat portions 8 is a channel 2 serving as a space for performing a treatment to silicon carbide substrate 110.

Heat insulator 5 is a member configured to thermally insulate channel 2 from the outside of epitaxial growth device 1. Heat insulator 5 is provided to surround the outer circumference portions of heating elements 6. Quartz tube 4 is provided to surround the outer circumference portion of heat insulator 5. Induction heating coil 3 is wound at the outer circumference portion of quartz tube 4.

Next, the following describes a crystal growth process employing epitaxial growth device 1 described above. First, silicon carbide substrate 110 prepared in the step (S10) is placed in channel 2 of epitaxial growth device 1. More specifically, silicon carbide substrate 110 is placed on a susceptor (not shown) provided on one heating element 6.

1. Step (S21) of Forming First Epitaxial Layer

Next, the step of forming the first epitaxial layer is performed. In this step, a source material gas having a C/Si ratio of less than 1 is used to form first epitaxial layer 121 (see FIG. 3) on silicon carbide substrate 110. First, after gas replacement in channel 2, a pressure in channel 2 is adjusted to a predetermined pressure such as 60 mbar to 100 mbar (6 kPa to 10 kPa) while letting a carrier gas to flow. The carrier gas may be, for example, hydrogen ($H_2$) gas, argon (Ar) gas, helium (He) gas, or the like. The flow rate of the carrier gas may be about 50 slm to 200 slm, for example. The unit for flow rate as used herein, i.e., "slm (Standard Liter per Minute)" represents "L/min" in a standard condition (0° C. and 101.3 kPa).

Next, a predetermined alternating current is supplied to the induction heating coil, thereby inductively heating elements 6. Accordingly, channel 2 and the susceptor having silicon carbide substrate 110 placed thereon are heated to a predetermined reaction temperature. On this occasion, the susceptor is heated to about 1500° C. to 1750° C., for example.

Next, a source material gas is supplied. The source material gas includes a Si source gas and a C source gas. Examples of the Si source gas include silane ($SiH_4$) gas, disilane ($Si_2H_6$) gas, dichlorosilane ($SiH_2Cl_2$) gas, trichlorosilane ($SiHCl_3$) gas, silicon tetrachloride ($SiCl_4$) gas, and the like. That is, the Si source gas may be at least one selected from a group consisting of silane gas, disilane gas, dichlorosilane gas, trichlorosilane gas and silicon tetrachloride gas.

Examples of the C source gas includes methane ($CH_4$) gas, ethane ($C_2H_6$) gas, propane ($C_3H_8$) gas, acetylene ($C_2H_2$) gas, and the like. That is, the C source gas may be at least one selected from a group consisting of methane gas, ethane gas, propane gas, and acetylene gas.

The source material gas may include a dopant gas. Examples of the dopant gas include nitrogen gas, ammonia gas, and the like.

The source material gas in the step of forming the first epitaxial layer may be a mixed gas of silane gas and propane gas, for example. In the step of forming the first epitaxial layer, the C/Si ratio of the source material gas is adjusted to less than 1. For example, the C/Si ratio may be not less than 0.5, not less than 0.6, or not less than 0.7 as long as the C/Si ratio is less than 1. Moreover, for example, the C/Si ratio may be not more than 0.95, not more than 0.9, or not more than 0.8. The flow rate of the silane gas and the flow rate of the propane gas may be adjusted appropriately in a range of about 10 to 100 sccm to achieve a desired C/Si ratio, for example. The unit for flow rate as used herein, i.e., "sccm (Standard Cubic Centimeter per Minute)" represents "mL/min" in a standard condition (0° C. and 101.3 kPa).

A film formation rate in the step of forming the first epitaxial layer may be about not less than 3 μm/h and not more than 30 μm/h, for example. The first epitaxial layer has a thickness of not less than 0.1 μm and not more than 150 μm, for example. Moreover, the thickness of the first epitaxial layer may be not less than 0.2 μm, may be not less than 10 μm, and may be not less than 15 μm. Moreover, the thickness of the first epitaxial layer may be not more than 100 μm, may be not more than 75 μm, or may be not more than 50 μm.

2. Step (S22) of Reconstructing Surface of First Epitaxial Layer

Next, the step of reconstructing the surface of the first epitaxial layer is performed. The step of reconstructing the surface may be performed continuous to the step of forming the first epitaxial layer. Alternatively, a predetermined halt time may be provided between the step of forming the first epitaxial layer and the step of reconstructing the surface. In the step of reconstructing the surface, the temperature of the susceptor may be increased by about 10° C. to 30° C.

In the step of reconstructing the surface, a mixed gas including a source material gas having a C/Si ratio of less than 1 and hydrogen gas is used. The C/Si ratio of the source material gas may be lower than the C/Si ratio in the step of forming the first epitaxial layer. The C/Si ratio may be not less than 0.5, not less than 0.6, or not less than 0.7 as long as the C/Si ratio is less than 1. Moreover, for example, the C/Si ratio may be not more than 0.95, not more than 0.9, or not more than 0.8.

In the step of reconstructing the surface, there may be used a source material gas different from the source material gas used in each of the step of forming the first epitaxial layer and a below-described step of forming a second epitaxial layer. In this way, it is expected to increase an effect of attaining a shallow pit portion. For example, it is considered to configure such that in each of the step of forming the first epitaxial layer and the below-described step of forming the second epitaxial layer, silane gas and propane gas are used, whereas in the step of reconstructing the surface, dichlorosilane and acetylene are used.

In the step of reconstructing the surface, the ratio of the flow rate of the source material gas to the flow rate of the hydrogen gas may be decreased as compared with those in the step of forming the first epitaxial layer and the below-described step of forming the second epitaxial layer. Accordingly, it is expected to increase the effect of attaining a shallow pit portion.

The flow rate of the hydrogen gas in the mixed gas may be about not less than 100 slm and not more than 150 slm, for example. The flow rate of the hydrogen gas may be about 120 slm, for example. The flow rate of the Si source gas in the mixed gas may be not less than 1 sccm and not more than 5 sccm, for example. The lower limit of the flow rate of the Si source gas may be 2 sccm. The upper limit of the flow rate of the Si source gas may be 4 sccm. The flow rate of the C source gas in the mixed gas may be not less than 0.3 sccm and not more than 1.6 sccm, for example. The lower limit of the flow rate of the C source gas may be 0.5 sccm or 0.7 sccm. The upper limit of the C source gas may be 1.4 sccm or 1.2 sccm.

In the step of reconstructing the surface, it is desirable to adjust various conditions such that etching by the hydrogen gas is comparable to epitaxial growth by the source material gas. For example, it is considered to adjust the flow rate of the hydrogen gas and the flow rate of the source material gas to attain a film formation rate of about 0±0.5 μm/h. The film formation rate may be adjusted to about 0±0.4 μm/h, may be adjusted to about 0±0.3 μm/h, may be adjusted to about 0±0.2 μm/h, or may be adjusted to about 0±0.1 μm/h. Accordingly, it is expected to increase the effect of attaining a shallow pit portion.

A treatment time in the step of reconstructing the surface is about not less than 30 minutes and not more than 10 hours, for example. The treatment time may be not more than 8 hours, may be not more than 6 hours, may be not more than 4 hours, or may be not more than 2 hours.

3. Step (S23) of Forming Second Epitaxial Layer

After reconstructing the surface of the first epitaxial layer, the step of forming the second epitaxial layer on this surface is performed. Second epitaxial layer 122 (see FIG. 3) is formed using a source material gas having a C/Si ratio of not less than 1. For example, the C/Si ratio may be not less than 1.05, may be not less than 1.1, may be not less than 1.2, may be not less than 1.3, or may be not less than 1.4 as long as the C/Si ratio is not less than 1. Moreover, the C/Si ratio may be not more than 2.0, may be not more than 1.8, or may be not more than 1.6.

The source material gas in the step of forming the second epitaxial layer may be the same as or different from the source material gas used in the step of forming the first epitaxial layer. The source material gas may be silane gas and propane gas, for example. The flow rate of the silane gas and the flow rate of the propane gas may be adjusted appropriately in a range of about 10 to 100 sccm to achieve a desired C/Si ratio, for example. The flow rate of the carrier gas may be about 50 slm to 200 slm, for example.

The film formation rate in the step of forming the second epitaxial layer may be about not less than 5 μm/h and not more than 100 μm/h, for example. The second epitaxial layer has a thickness of not less than 1 μm and not more than 150 μm, for example. Moreover, the thickness of the second epitaxial layer may be not less than 5 μm, may be not less than 10 μm, and may be not less than 15 μm. Moreover, the thickness of the second epitaxial layer may be not more than 100 μm, may be not more than 75 μm, or may be not more than 50 μm.

The thickness of second epitaxial layer 122 may be the same as or different from the thickness of first epitaxial layer 121. Second epitaxial layer 122 may be thinner than first epitaxial layer 121. For example, a ratio of the thickness of second epitaxial layer 122 to the thickness of first epitaxial layer 121 may be about not less than 0.01 and not more than 0.9. Here, the ratio of the thicknesses represents a value obtained by dividing the thickness of the second epitaxial layer by the thickness of the first epitaxial layer having been through the step of reconstructing the surface. The ratio of the thicknesses may be not more than 0.8, may be not more than 0.7, may be not more than 0.6, may be not more than 0.5, may be not more than 0.4, may be not more than 0.3, may be not more than 0.2, or may be not more than 0.1. Accordingly, it is expected to increase the effect of attaining a shallow pit portion.

In this way, as shown in FIG. 3, silicon carbide epitaxial layer 120 is formed which includes first epitaxial layer 121 and second epitaxial layer 122. In the silicon carbide epitaxial layer, the first epitaxial layer and second epitaxial layer may be incorporated completely such that they cannot be distinguished from each other.

As shown in FIG. 4, groove portion 20 is formed in first main surface 101 of silicon carbide epitaxial layer 120. Groove portion 20 extends in the one direction along first main surface 101 when viewed in plan. More specifically, groove portion 20 extends in the step-flow growth direction, which is along the off direction of the off angle relative to the (0001) plane. In other words, groove portion 20 extends in a direction in a range of not more than ±5° relative to the <11-20> direction or a direction in a range of not more than ±5° relative to the <01-10> direction.

The width (second width 82) of groove portion 20 in the above-described one direction is twice or more as large as, preferably, five times or more as large as the width (third width 83) thereof in the direction perpendicular to the one direction. Second width 82 is not less than 15 μm and not more than 50 μm, preferably, not less than 25 μm and not more than 35 μm. Third width 83 is not less than 1 μm and not more than 5 μm, preferably, not less than 2 μm and not more than 3 μm.

As shown in FIG. 3, groove portion 20 is formed to extend in the step-flow growth direction from threading dislocation 40 included in silicon carbide epitaxial layer 120. More specifically, groove portion 20 includes: a first groove portion 21 formed on threading dislocation 40; and a second groove portion 22 formed to be connected to first groove portion 21 and extend from first groove portion 21 in the step-flow growth direction.

First groove portion 21 is formed at one end portion (left end portion in FIG. 3) of groove portion 20 in the step-flow growth direction. Moreover, the maximum depth (second depth 72) of first groove portion 21 from first main surface 101 is not more than 10 nm. Second depth 72 is the maximum depth in the entire groove portion 20 as shown in FIG. 3. Moreover, first groove portion 21 preferably has a width (first width 81) of not more than 1 μm, and more preferably has a width (first width 81) of not more than 0.5 μm.

As shown in FIG. 3, second groove portion 22 is formed to extend from its portion of connection with first groove portion 21 to the other end portion opposite to the above-described one end portion (right end portion in FIG. 3). Moreover, second groove portion 22 is formed such that the depth (first depth 71) of second groove portion 22 from first main surface 101 is smaller than the maximum depth (second depth 72) of first groove portion 21. More specifically, second groove portion 22 extends in the step-flow growth direction while maintaining the depth shallower than the maximum depth (second depth 72) of first groove portion 21. First depth 71 is preferably not more than 3 nm, is more preferably not more than 2 nm, and is further preferably not more than 1 nm. Moreover, second groove portion 22 has a width (fourth width 84) of, for example, not less than 20 μm, preferably, not less than 25 μm.

Next, as a step (S40), an ion implantation step is performed. In this step (S40), as shown in FIG. 11, for example, aluminum (Al) ions are implanted into silicon carbide epitaxial layer 120 from the first main surface 101 side, thereby forming body regions 62. When viewed in cross section, a region interposed between body regions 62 is JFET region 61. Surface 161 of JFET region 61 constitutes a portion of first main surface 101. Preferably, body regions 62 are formed such that the width (fifth width 85) of surface 161 of JFET region 61 becomes not less than 1.5 μm and not more than 3.5 μm. Preferably, each of body regions 62 is formed by ion implantation. An implantation mask used for the ion implantation has a width of not more than 2.4 μm, for example. Maximum ion implantation energy is suppressed to not more than 970 keV, for example. The impurity concentration of the portion of body region 62 in contact with first main surface 101 is, for example, not less than $1 \times 10^{16}$ cm$^{-3}$ and not more than $1 \times 10^{18}$ cm$^{-3}$. Preferably, JFET region 61 is formed such that groove portion 20 is disposed in surface 161. More preferably, JFET region 61 is formed such that first groove portion 21 is disposed in surface 161.

Next, for example, phosphorus (P) ions are implanted into body region 62, thereby forming source region 63. Next, for example, aluminum (Al) ions are implanted into body region 62, thereby forming contact region 64 adjacent to source region 63. In silicon carbide epitaxial layer 120, a region in which none of body region 62, source region 63, and contact region 64 is formed serves as drift region 60. Drift region 60 includes JFET region 61. JFET region 61 is a region that constitutes a portion of first main surface 101 and that is interposed between the portions of body regions 62. Drift region 60 includes: a region interposed between JFET region 61 and silicon carbide substrate 110; and a region interposed between each body region 62 and silicon carbide substrate 110. First main surface 101 is constituted of surface 161 of JFET region 61, surface 162 of body region 62, surface 163 of source region 63, and surface 164 of contact region 64.

Next, an activation annealing step is performed as a step (S50). In this step (S50), for example, as shown in FIG. 11, silicon carbide epitaxial layer 120 is heated at about 1800° C. in an argon atmosphere, thereby activating each of the n type and p type impurities having been introduced in silicon carbide epitaxial layer 120 through ion implantation. Accordingly, desired carriers are generated in each of body region 62, source region 63, and contact region 64 within silicon carbide epitaxial layer 120. In this way, silicon carbide epitaxial layer 120 is prepared which includes: JFET region 61 having n type conductivity; body region 62 provided on drift region 60 and having p type conductivity different from n type conductivity; and source region 63 separated from JFET region 61 by body region 62 and having n type conductivity.

Figure 12:
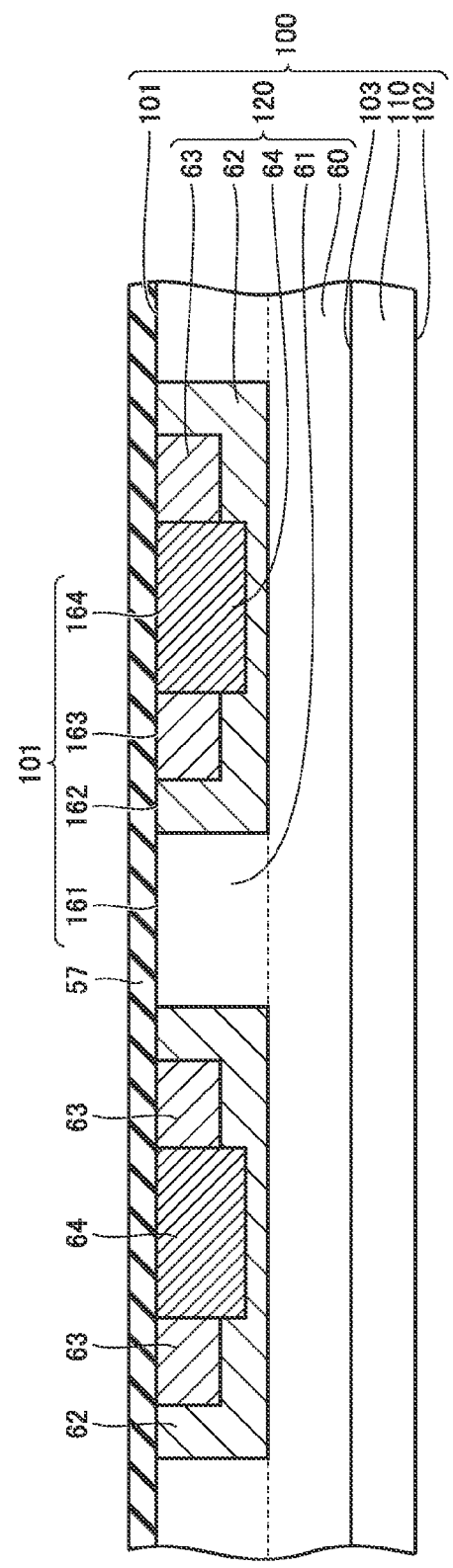
FIG. 12 is a schematic cross sectional view showing a third step of the method for manufacturing the silicon carbide semiconductor device according to the present embodiment.

Next, a gate insulating film forming step is performed as a step (S60). In this step (S60), for example, as shown in FIG. 12, epitaxial wafer 100 is thermally oxidized in an atmosphere including oxygen (O$_2$), whereby gate insulating film 57 composed of a material including silicon dioxide (SiO$_2$) is formed on first main surface 101. Gate insulating film 57 is formed in contact with JFET region 61, body region 62, and source region 63. In surface 161 of JFET region 61 in contact with gate insulating film 57, groove portion 20 (see FIG. 3) is formed. Groove portion 20 extends in one direction along surface 161. Second width 82 of groove portion 20, which is a width in one direction, is twice or more as large as third width 83 of groove portion 20, which is a width in a direction perpendicular to the one direction. Second depth 72 of groove portion 20, which is the maximum depth from surface 161, is not more than 10 nm. That is, in surface 161 of JFET region 61, pit portion 30 is suppressed from being formed (FIG. 3), thereby reducing variation in thickness of gate insulating film 57 formed on surface 161 of JFET region 61. Gate insulating film 57 has an average film thickness of not less than 40 nm and not more than 100 nm, for example.

Next, a nitrogen annealing step is performed as a step (S65). Specifically, after the step of forming gate insulating film 57, gate insulating film 57 is heated at a temperature of not less than 1100° C. in an atmosphere including nitrogen atoms. Examples of the atmosphere including nitrogen include nitrogen monoxide (NO), dinitrogen oxide (N$_2$O), nitrogen dioxide (NO$_2$), ammonia, and the like. Preferably, epitaxial wafer 100 having gate insulating film 57 formed thereon is held for about 1 hour at a temperature of not less than 1100° C. and not more than 1400° C. in a gas including nitrogen, for example.

Next, a gate electrode forming step is performed as a step (S70). In this step (S70), for example, LP (Low Pressure) CVD is employed to form gate electrode 51 that is in contact with gate insulating film 57 and that is composed of a conductive material including polysilicon having an impurity added therein. Gate electrode 51 is formed on gate insulating film 57 at a location facing surface 161 of JFET region 61, surface 162 of body region 62, and surface 163 of source region 63.

Next, an interlayer insulating film forming step is performed as a step (S80). In this step (S80), for example, CVD is employed to form interlayer insulating film 56 on gate insulating film 57 to cover gate electrode 51. Interlayer insulating film 56 is composed of a material including silicon dioxide, for example.

Figure 13:
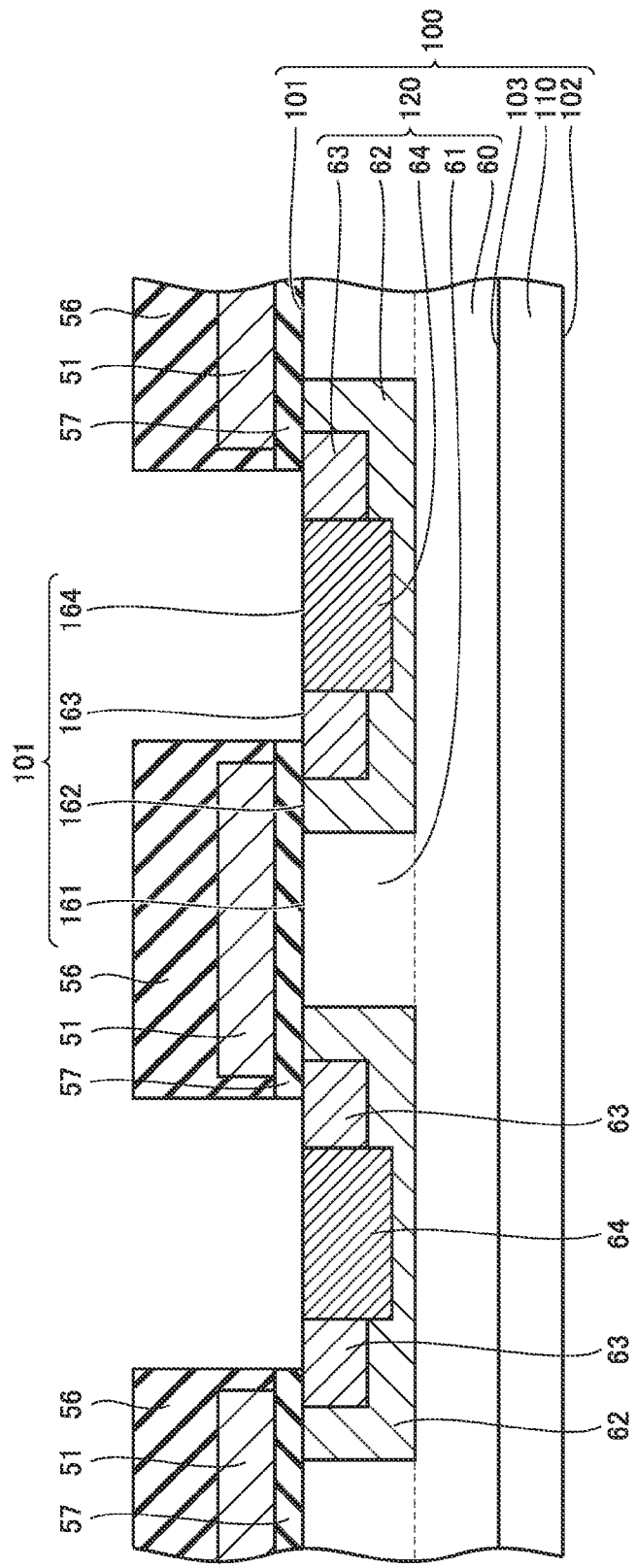
FIG. 13 is a schematic cross sectional view showing a fourth step of the method for manufacturing the silicon carbide semiconductor device according to the present embodiment.

Next, an ohmic electrode forming step is performed as a step (S90). In this step (S90), with reference to FIG. 13, gate insulating film 57 and interlayer insulating film 56 are first removed by etching from the region in which source electrode 52 is to be formed. This leads to formation of a region in which source region 63 and contact region 64 are exposed. In this region, a metal film including Ti, Al, and Ni is formed in contact with both source region 63 and contact region 64, for example. Next, the metal film is heated, whereby at least a portion of the metal film is silicided. Accordingly, on first main surface 101, source electrode 52 is formed in contact with both source region 63 and contact region 64.

Next, a pad electrode forming step is performed as a step (S100). In this step (S100), for example, vapor deposition is employed to form source pad electrode 54 composed of a conductor including aluminum, so as to cover source electrode 52 and interlayer insulating film 56. Next, drain electrode 53 is formed in contact with second main surface 102 of silicon carbide substrate 110. Next, for example, backside pad electrode 55 composed of a conductor including aluminum is formed in contact with drain electrode 53.

Then, the wafer is divided into a plurality of semiconductor chips through predetermined dicing. In this way, a semiconductor chip including a plurality of unit cells as shown in FIG. 1, i.e., a silicon carbide semiconductor device is obtained.

In the above embodiment, it has been illustrated that the first conductivity type corresponds to n type conductivity and the second conductivity type corresponds to p type conductivity; however, the first conductivity type may correspond to p type conductivity and the second conductivity type may correspond to n type conductivity. Moreover, in the present embodiment, it has been illustrated that the silicon carbide semiconductor device is a planer type MOSFET; however, the silicon carbide semiconductor device may be an IGBT (Insulated Gate Bipolar Transistor).

Next, the following describes function and effect of the MOSFET and the method for manufacturing the MOSFET according to the present embodiment.

In accordance with MOSFET 1000 according to the present embodiment, groove portion 20 is formed in surface 161 of first impurity region 61, surface 161 being in contact with gate insulating film 57, groove portion 20 extending in the one direction along surface 161, second width 82 of groove portion 20, which is the width in the one direction, being twice or more as large as third width 83 of groove portion 20, which is the width in the direction perpendicular to the one direction, second depth 72 of groove portion 20, which is the maximum depth from surface 161, being not more than 10 nm. That is, in accordance with MOSFET 1000 according to the present embodiment, by controlling the conditions for epitaxial growth of silicon carbide epitaxial layer 120 and the like, a larger number of groove portions 20 are formed than the above-described pit portions each having a depth of several ten nm. Hence, in MOSFET 1000 according to the present embodiment, variation in film thickness of gate insulating film 57 can be reduced as compared with that in the conventional MOSFET in which the multiplicity of pit portions 30 are formed. As a result, long-term reliability of MOSFET 1000 is improved.

Moreover, in accordance with MOSFET 1000 according to the present embodiment, fifth width 85 is not less than 1.5 μm and not more than 3.5 μm, fifth width 85 being the width of surface 161 of JFET region 61 in the direction along the direction parallel to surface 161 of JFET region 61. By setting fifth width 85 at not less than 1.5 μm, it is possible to suppress significant increase of transistor resistance resulting from increase of JFET resistance. By setting fifth width 85 at not more than 3.5 μm, gate insulating film 57 on JFET region 61 is protected by depletion from body region 62, and increase of on resistance resulting from increase of unit cell area can be suppressed.

Moreover, in accordance with MOSFET 1000 according to the present embodiment, thickness 157 of gate insulating film 57 in the direction perpendicular to surface 161 of JFET region 61 is not less than 40 nm and not more than 100 nm. By setting thickness 157 at not less than 40 nm, reliability of gate insulating film 57 can be suppressed from being decreased. By setting thickness 157 at not more than 100 nm, it is possible to suppress increase of voltage applied between gate electrode 51 and source electrode 52 and required to turn on the transistor.

Further, in accordance with MOSFET 1000 according to the present embodiment, the density of nitrogen atoms in boundary region 200 between gate insulating film 57 and first impurity region 61 is not less than $10^{18}$ cm$^{-3}$. Accordingly, reliability of gate insulating film 57 can be improved.

Further, in accordance with MOSFET 1000 according to the present embodiment, groove portion 20 includes first groove portion 21 and second groove portion 22 connected to first groove portion 21. First groove portion 21 is formed in one end portion of groove portion 20 in the one direction, and the maximum depth of first groove portion 21 from surface 161 is not more than 10 nm. Second groove portion 22 is formed to extend in the one direction from first groove portion 21 to the other end portion opposite to the one end portion, and is formed such that first depth 71 of second groove portion 22, which is the depth from surface 161, is smaller than the maximum depth of first groove portion 21. In MOSFET 1000 in which groove portion 20 having the above structure is formed, the formation of pit portions that would have otherwise caused increase of variation in film thickness of gate insulating film 57 is suppressed. Accordingly, in accordance with MOSFET 1000, variation in film thickness of gate insulating film 57 can be reduced. As a result, long-term reliability of MOSFET 1000 is improved.

Further, in accordance with MOSFET 1000 according to the present embodiment, gate insulating film 57 is provided on first groove portion 21. In accordance with MOSFET 1000, variation in film thickness of gate insulating film 57 can be reduced. As a result, long-term reliability of MOSFET 1000 is improved.

Further, MOSFET 1000 according to the present embodiment further includes silicon carbide substrate 110 having an off angle of not more than ±4° relative to the (0001) plane. Silicon carbide epitaxial layer 120 is a layer epitaxially grown on silicon carbide substrate 110. Groove portion 20 is formed to extend from threading dislocation 40 in silicon carbide epitaxial layer 120 in the step-flow growth direction that is along the off direction of the off angle. As described above, groove portion 20 is formed to extend in the step-flow growth direction. In silicon carbide semiconductor device 1000 in which such a groove portion 20 is formed, formation of minute pits that would have otherwise caused decrease of long-term reliability of the device is suppressed. Accordingly, in accordance with MOSFET 1000, variation in film thickness of gate insulating film 57 can be reduced. Accordingly, long-term reliability of MOSFET 1000 is improved.

Further, in accordance with MOSFET 1000 according to the present embodiment, the off direction is in a range of not more than ±5° relative to the <11-20> direction. Thus, third main surface 103 may be inclined relative to the (0001) plane in the predetermined off direction.

Further, in accordance with MOSFET 1000 according to the present embodiment, the off direction is in a range of not more than ±5° relative to the <01-10> direction. Thus, third main surface 103 may be inclined relative to the (0001) plane in the predetermined off direction.

In accordance with the method for manufacturing MOSFET 1000 according to the present embodiment, by controlling the conditions for epitaxial growth of silicon carbide epitaxial layer 120 and the like, a larger number of groove portions 20 are formed than the above-described pit portions each having a depth of several ten nm. Accordingly, in accordance with the method for manufacturing MOSFET 1000, there can be manufactured MOSFET 1000 in which variation in film thickness of gate insulating film 57 is reduced as compared with that in the conventional MOSFET in which the multiplicity of pit portions are formed. That is, MOSFET 1000 with improved long-term reliability can be manufactured.

Moreover, the method for manufacturing MOSFET 1000 according to the present embodiment further includes the step of heating gate insulating film 57 at a temperature of not less than 1100° C. in the atmosphere including nitrogen atoms after the step of forming gate insulating film 57. Accordingly, reliability of gate insulating film 57 can be improved.

[Evaluation]

1. Production of Sample

Silicon carbide substrates 110 each having a diameter of 150 mm were prepared. In each of silicon carbide substrates 110, the off direction of third main surface 103 was the <11-20> direction and third main surface 103 had an off angle of 4° relative to the (0001) plane.

A sample 1 had an epitaxial layer formed using the manufacturing method according to the present disclosure. A sample 2 had an epitaxial layer formed using a manufacturing method obtained by omitting, from the manufacturing method according to the present disclosure, the step (S22) of reconstructing the surface of the first epitaxial layer. In each of sample 1 and sample 2, the epitaxial layer had a film thickness of 15 µm.

2. Evaluation of Shape of Groove Portion

In each sample, the shape of the groove portion formed in first main surface 101 of silicon carbide epitaxial layer 120 was evaluated using a defect inspection device and an AFM. The result is shown in Table 1. The defect inspection device as used herein was WASAVI series "SICA 6X" (Objective lens: ×10) provided by Lasertec Corporation.

The AFM as used herein may be "Dimension 300" provided by Veeco, for example. Moreover, for a cantilever (probe) of the AFM, "NCHV-10V" provided by Bruker may be used, for example. For measurement conditions of the AFM, a measurement mode was set at a tapping mode, a measurement area in the tapping mode was set at a square having each side of 20 µm, and a measurement depth was set at 1.0 µm. Moreover, sampling in the tapping mode was performed under conditions that scanning speed in the measurement area was set at 5 seconds for one cycle, the number of data for each scan line was set at 512 points, and the number of the scan lines was set at 512. Moreover, displacement control for the cantilever was set at 15.50 nm.

TABLE 1

|  | Sample 1 | Sample 2 |
| --- | --- | --- |
| Maximum Depth (Second Depth) of First Groove Portion | 3 nm | 25 nm |
| Depth (First Depth) of Second Groove Portion | Not More Than 1 nm | — |
| Width (Second Width) in One Direction | 25 µm | 1 µm |
| Width (Third Width) in Perpendicular Direction | 2 µm | 1 µm |

As shown in Table 1, in sample 1, groove portion 20 was detected in which second width 82 was twice or more as large as third width 83. Second width 82 is a width that extends in the step-flow growth direction (i.e., "one direction") along first main surface 101 and that is in the step-flow growth direction, and third width 83 is a width that is in the direction perpendicular to the step-flow growth direction.

Further, as a result of detailed inspection on the shape of groove portion 20 in sample 1, it was found that a portion exhibiting the maximum depth was included in one end portion within groove portion 20. The depth of the portion exhibiting the maximum depth was 3 nm. The depth of a portion extending from this portion to the other end portion was not more than 1 nm. That is, groove portion 20 in sample 1 included first groove portion 21 and second groove portion 22 connected to first groove portion 21, wherein first groove portion 21 was formed at one end portion of groove portion 20 in the step-flow growth direction, second groove portion 22 extends in the step-flow growth direction from first groove portion 21 to the other end portion opposite to the one end portion, and first depth 71, which was the depth from first main surface 101, was smaller than second depth 72, which was the maximum depth of the first groove portion.

On the other hand, in sample 2, a multiplicity of groove portions, i.e., pit portions 30, were detected in each of which second width 82 and third width 83 were substantially the same and second depth 72, i.e., the maximum depth was more than 10 nm. In Table 1, for convenience, the maximum depth of the groove portion in sample 2 is illustrated in the column for the maximum depth of the first groove portion.

3. Evaluation of Variation in Film Thickness of Gate Insulating Film

For each of samples 1 and 2, the ion implantation step (S40) and the activation annealing step (S50) were performed as described above, thereby forming the various impurity regions shown in FIG. 11.

By heating samples 1 and 2 in an atmosphere including oxygen, gate insulating film 57 was formed on first main surface 101 of silicon carbide epitaxial layer 120.

Furthermore, the gate insulating film was observed with a transmission electron microscope to measure variation in film thickness of the gate insulating film. The result is shown in Table 2.

TABLE 2

|  | Sample 1 | Sample 2 |
| --- | --- | --- |
| Film Thickness of Portion Having No Groove Portion (nm) | 52 | 52 |
| Minimum Film Thickness in the Vicinity of Groove Portion (nm) | 51 | 49 |
| Maximum Film Thickness in the Vicinity of Groove Portion (nm) | 51 | 60 |
| Variation in Film Thickness (A/B) | −1/−1 | +8/−3 |

In the column "Variation in Film Thickness" in Table 2, "A/B" is illustrated to represent a difference (A) between the maximum film thickness in the vicinity of the groove portion and the film thickness of the portion having no groove portion, as well as a difference (B) between the minimum film thickness in the vicinity of the groove portion and the film thickness of the portion having no groove portion. Here, it is indicated that as A and B are both smaller values, variation in film thickness is smaller. As shown in Table 2, the variation in film thickness in sample 1 was smaller than that in sample 2 and therefore sample 1 was excellent.

4. Evaluation of Reliability of Silicon Carbide Semiconductor Device

For each of sample 1 and sample 2, the gate electrode forming step (S70) to the pad electrode forming step (S100) were sequentially performed. Furthermore, the epitaxial wafer was diced, thereby manufacturing 22 silicon carbide semiconductor devices, serving as MOSFETs, in the form of chips from each sample.

Long-term reliability of each silicon carbide semiconductor device was evaluated using constant current TDDB (Time Dependent Dielectric Breakdown). The constant current TDDB was performed under an environment of 25° C. with a constant current density of 20 mA/cm$^2$. The result is shown in FIG. 14.

Figure 14:
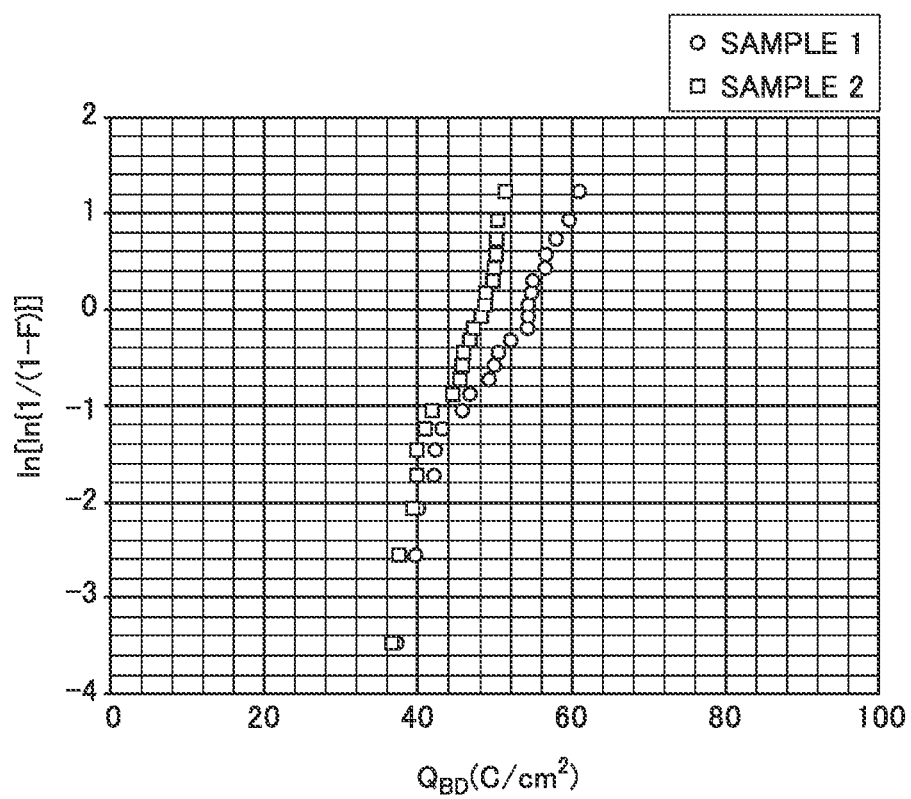
FIG. 14 is a Weibull plot showing a result of measurement of constant current TDDB.

FIG. 14 is a Weibull plot showing the result of measurement of constant current TDDB. In FIG. 14, the vertical axis represents a cumulative failure rate plotted to a Weibull chart, whereas the horizontal axis represents a Charge to Breakdown ($Q_{BD}$). In FIG. 14, as $Q_{BD}$ [unit: C/cm$^2$] is larger, long-term reliability is more excellent. In FIG. 14, a group of plots constituted of circular legends represent the silicon carbide semiconductor devices manufactured from sample 1, whereas a group of plots constituted of quadrangular legends represent the silicon carbide semiconductor devices manufactured from sample 2.

As understood from FIG. 14, the silicon carbide semiconductor devices manufactured from sample 1 have larger $Q_{BD}$ and therefore have more excellent long-term reliability than the silicon carbide semiconductor devices manufactured from sample 2. This result is considered to be obtained because variation in film thickness of the gate insulating film in sample 1 is small.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: epitaxial growth device; 2: channel; 3: induction heating coil; 4: quartz tube; 5: heat insulator; 6: heating element; 7: curved portion; 8: flat portion; 20: groove portion; 21: first groove portion; 22: second groove portion; 30: pit portion; 40: threading dislocation; 51: gate electrode; 52: source electrode; 53: drain electrode; 54: source pad electrode; 55: backside pad electrode; 56: interlayer insulating film; 57: gate insulating film; 60: drift region; 61: first impurity region (JFET region); 62: second impurity region (body region); 63: third impurity region (source region); 64: contact region; 71: first depth; 72: second depth; 73: third depth; 81: first width; 82: second width; 83: third width; 84: fourth width; 85: fifth width; 100: epitaxial wafer; 101: first main surface; 102: second main surface; 103: third main surface; 110: silicon carbide substrate; 120: silicon carbide epitaxial layer; 121: first epitaxial layer; 122: second epitaxial layer; 157: thickness; 161, 162, 163, 164: surface; 200: boundary region; 201: first imaginary plane; 202: second imaginary plane; 1000: silicon carbide semiconductor device (MOSFET).

The invention claimed is:

1. A silicon carbide semiconductor device comprising: a silicon carbide epitaxial layer including a first impurity region, a second impurity region, and a third impurity region, the first impurity region having a first conductivity type, the second impurity region being provided in contact with the first impurity region, the second impurity region having a second conductivity type different from the first conductivity type, the third impurity region being separated from the first impurity region by the second impurity region, the third impurity region having the first conductivity type; and a gate insulating film in contact with the first impurity region, the second impurity region, and the third impurity region, a groove portion being formed in a surface of the first impurity region, the surface being in contact with the gate insulating film, the groove portion extending in one direction along the surface, a width of the groove portion in the one direction being twice or more as large as a width of the groove portion in a direction perpendicular to the one direction, a maximum depth of the groove portion from the surface being not more than 10 nm, the groove portion including a first groove portion and a second groove portion connected to the first groove portion, the first groove portion being formed in one end portion of the groove portion in the one direction, the second groove portion extending in the one direction from the first groove portion to the other end portion opposite to the one end portion, a depth of the second groove portion from the surface being smaller than a maximum depth of the first groove portion, the depth of the second groove portion is more uniform in the one direction than the depth of the first groove portion.

2. The silicon carbide semiconductor device according to claim 1, wherein a width of the surface of the first impurity region in a direction along a direction parallel to the surface of the first impurity region is not less than 1.5 μm and not more than 3.5 μm.

3. The silicon carbide semiconductor device according to claim 1, wherein a thickness of the gate insulating film in a direction perpendicular to the surface of the first impurity region is not less than 40 nm and not more than 100 nm.

4. The silicon carbide semiconductor device according to claim 1, wherein a density of nitrogen atoms is not less than $10^{18}$ cm$^{-3}$ in a boundary region between the gate insulating film and the first impurity region.

5. The silicon carbide semiconductor device according to claim 1, wherein the gate insulating film is provided on the first groove portion.

6. The silicon carbide semiconductor device according to claim 1, wherein the groove portion is rectangle-shaped in plan view.

7. The silicon carbide semiconductor device according to claim 1, wherein the width of the groove portion in the one direction is not less than 15 μm and not more than 50 μm.

8. A silicon carbide semiconductor device comprising: a silicon carbide epitaxial layer including a first impurity region, a second impurity region, and a third impurity region, the first impurity region having a first conductivity type, the second impurity region being provided in contact with the first impurity region, the second impurity region having a second conductivity type different from the first conductivity type, the third impurity region being separated from the first impurity region by the second impurity region, the third impurity region having the first conductivity type; and a gate insulating film in contact with the first impurity region, the second impurity region, and the third impurity region, a groove portion being formed in a surface of the first impurity region, the surface being in contact with the gate insulating film, the groove portion extending in one direction along the surface, a width of the groove portion in the one direction being twice or more as large as a width of the groove portion in a direction perpendicular to the one direction, a maximum depth of the groove portion from the surface being not more than 10 nm, the groove portion including a first groove portion and a second groove portion connected to the first groove portion, the first groove portion being formed in one end portion of the groove portion in the one direction, the second groove portion extending in the one direction from the first groove portion to the other end portion opposite to the one end portion, a depth of the second groove portion from the surface being smaller than a maximum depth of the first groove portion, wherein the first groove portion is v-shaped in cross-section and the second groove portion is not v-shaped in cross-section.

* * * * *